United States Patent
Jung

(10) Patent No.: US 8,963,582 B2
(45) Date of Patent: Feb. 24, 2015

(54) SIGNAL AMPLIFICATION CIRCUIT AND METHOD

(71) Applicant: SK Hynix Inc., Gyeonggi-do (KR)

(72) Inventor: Hae-Kang Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 13/721,345

(22) Filed: Dec. 20, 2012

(65) Prior Publication Data

US 2014/0002193 A1    Jan. 2, 2014

(30) Foreign Application Priority Data

Jun. 27, 2012  (KR) .......................... 10-2012-0069182

(51) Int. Cl.
| | |
|---|---|
| *H03K 19/0175* | (2006.01) |
| *H03F 3/45* | (2006.01) |
| *G11C 7/06* | (2006.01) |
| *H03K 5/24* | (2006.01) |

(52) U.S. Cl.
CPC ............ *H03F 3/45071* (2013.01); *G11C 7/062* (2013.01); *H03K 5/2481* (2013.01)
USPC .................................. 326/80; 326/81; 326/63

(58) Field of Classification Search
None
See application file for complete search history.

(56) References Cited

U.S. PATENT DOCUMENTS

| | | | |
|---|---|---|---|
| 4,797,838 A * | 1/1989 | Nelson et al. | 326/94 |
| 5,896,045 A | 4/1999 | Siegel et al. | |
| 6,512,407 B2 * | 1/2003 | Horan et al. | 327/333 |
| 7,355,446 B2 * | 4/2008 | Kim | 326/81 |

FOREIGN PATENT DOCUMENTS

KR    1020100076544    7/2010

\* cited by examiner

*Primary Examiner* — Crystal L Hammond
(74) *Attorney, Agent, or Firm* — IP & T Group LLP

(57) ABSTRACT

A signal amplification circuit includes a differential amplification unit to differentially amplify an input signal and an input signal bar, to output to a first node and a second node, respectively, a first inverting element to output a first logic value to a first output node when the level of the amplified signal is higher than a logic threshold, and to output a second logic value to the first output node when the level of the amplified signal is lower than the logic threshold, a second inverting element to output the first logic value to a second output node when the level of the amplified signal bar is higher than the logic threshold, and to output the second logic value to the second output node when the level of the amplified signal bar is lower than the logic threshold, a first current path, and a second current path.

16 Claims, 15 Drawing Sheets

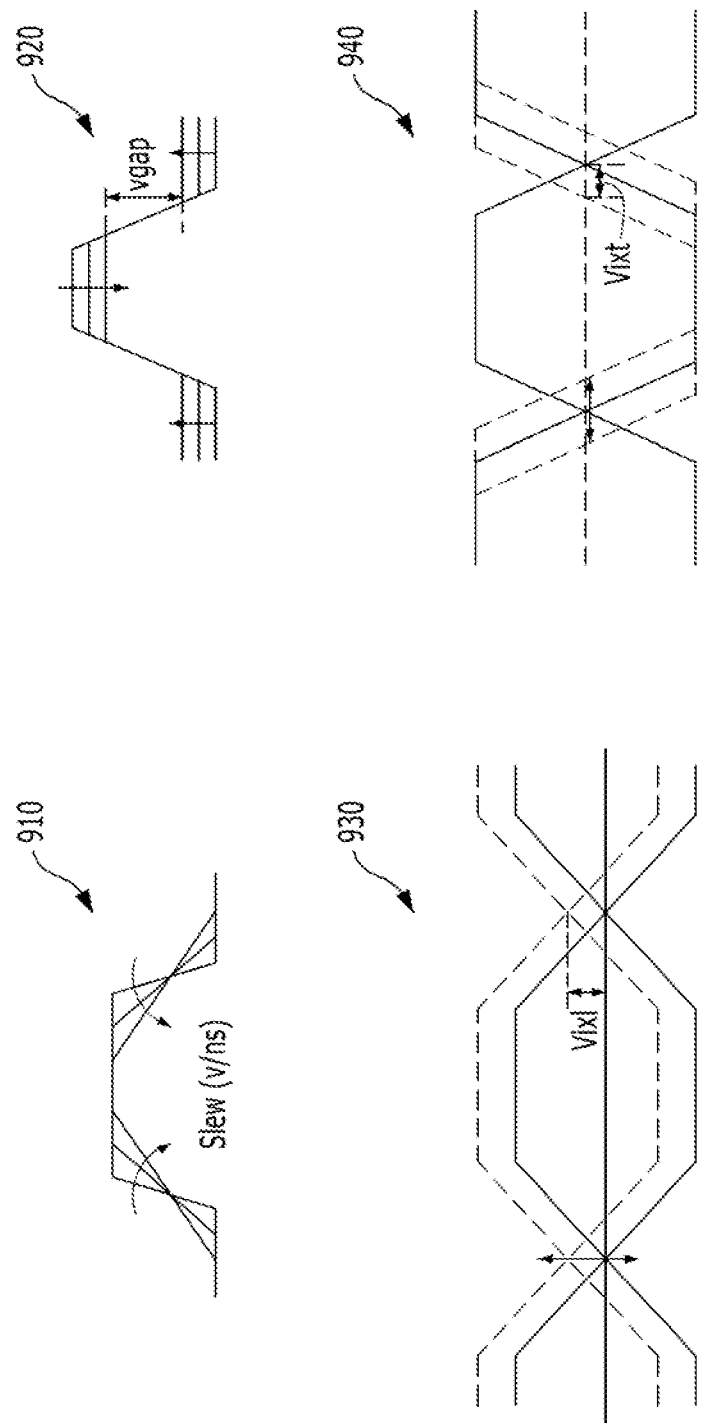

SIGNAL AMPLIFICATION CIRCUIT AND METHOD

CROSS-REFERENCE TO RELATED APPLICATIONS

The present application claims priority of Korean Patent Application No. 10-2012-0069182, filed on Jun. 27, 2012, which is incorporated herein by reference in its entirety.

BACKGROUND

1. Field

Exemplary embodiments of the present invention relate to a signal amplification circuit and method of reducing signal distortion in a device that an analog signal is amplified and converted into a digital signal.

2. Description of the Related Art

A signal amplification circuit is a circuit to amplify an input signal according to a gain. The reason to use the signal amplification circuits in the semiconductor device is in order to restore a signal distorted by various loadings or noises.

FIG. 1 is a configuration diagram illustrating a conventional signal amplification circuit.

Referring to FIG. 1, the signal amplification circuit includes a differential amplification unit 110 and inverting elements 120 and 130 configured to output different logic values depending on the levels of amplified signals OUT and OUTB of the differential amplification unit 110.

The differential amplification unit 110 is configured to amplify a voltage difference between an input signal IN and an input signal bar INB obtained by inverting the input signal IN, and generates an amplified signal OUT and an amplified signal bar OUTB. In a fully-differential input method that uses the input signals IN and INB, the input signals IN and INB have a symmetric waveform, and thus the amplified signals OUT and OUTB also have a symmetric waveform.

The first (1st) and the second (2nd) inverting elements 120 and 130 output a low-level signal when the level of the amplified signals OUT and OUTB are higher than a logic threshold, and a high-level signal when the level of the amplified signals OUT and OUTB are lower than the logic threshold. Output signals OUT1 and OUT2 respectively from the 1st and 2nd inverting elements 120 and 130 are the inverted versions of the input signals IN and INB.

FIG. 2 is a configuration diagram of the differential amplification unit 110.

Referring to FIG. 2, the differential amplification unit 110 may include two amplifiers 210 and 220. The 1st and 2nd amplifiers 210 and 220 have the same configuration, and include two NMOS transistors N1 and N2, two PMOS transistors P1 and P2, and a current source IS1. The two NMOS transistors N1 and N2 receive a power supply voltage VDD, and the sum of amounts of current flowing in the NMOS transistors N4 and N5 is constantly maintained by the current source IS1.

The 1st and 2nd amplifiers 210 and 220 respectively generate the amplified signals OUT and OUTB by amplifying a voltage difference between the input signals IN and INB.

When the voltage of a terminal A is higher than the voltage of a terminal B, a node C is pull-down driven by the NMOS transistor N1. Accordingly, the PMOS transistors P1 and P2 are turned on in response to the voltage of the node C, and an output node D is pull-up driven. On the other hand, when the voltage of the terminal A is higher than the voltage of the terminal B, the output node D is pull-down driven by the NMOS transistor N2.

The first amplifier 210 receives the input signals IN and INB through the terminals A and B, respectively, and outputs the amplified signal OUT. The 2nd amplifier 220 receives the input signal bar INB and the input signal IN through the terminals A and B, respectively, and outputs the amplified signal bar OUTB.

FIG. 3 is a configuration diagram of the inverting elements 120 and 130.

Referring to FIG. 3, the inverting element includes an NMOS transistor N3 and a PMOS transistor P3. When the voltage of an input node E is higher than the logic threshold, an output node F is pull-down driven by the NMOS transistor N3, and a low-level signal is outputted to the output node F. On the other hand, when the voltage of the input node E is lower than the logic threshold, the output node F is pull-up driven by the PMOS transistor P3 and a high-level signal is outputted to the output node F.

FIG. 4 is a waveform diagram illustrating concerns related to the conventional signal amplification circuit.

Due to the drivability limits of the transistors of the differential amplification unit 110 and the inverting elements 120 and 130, a signal may be delayed when passing through the differential amplification unit 110 and the inverting elements 120 and 130. The delay value may vary depending on the fabrication process of the amplification unit and the types of the transistors (NMOS or PMOS).

First waveform diagram 410 illustrates the waveforms of the amplified signals (OUT, OUTB), and the outputs (OUT1 and OUT2) of the 1st and 2nd inverting elements, illustrating the concerns raised by a delay difference according to the fabrication processes. It is supposed that there is only difference in delay among the fabrication processes, and that there are three fabrication processes, and that a time required for each transistor to completely drive a node is set to (1*unit time) for the first process, (3*unit time) for the second process, and (5*unit, time) for the third process.

In response to the transition of the input signal IN from a low level to a high level, the differential amplification unit 110 outputs a low level signal with the output node D of the 1st amplifier 210 pull-up driven by the PMOS transistor P2, and the output node F of the 1st inverting element 120 pull-down driven by the NMOS transistor N3. In the similar way, the differential amplification unit 110 outputs a high-level signal because the 2nd amplifier 210 and the 2nd inverting element 130 are driven in the different manner.

When the signal amplification circuit is fabricated by the first process, the amplifiers 210 and 220 require a driving time of (1*unit time), and the inverting elements 120 and 130 require a driving time of (1*unit time). Accordingly, (2*unit time) is required for completely driving the output of the 1st inverting element 120. Similarly, (6*unit time) is required in case of the second process, and (10*unit time) is required in case of the third process.

When the logic threshold LT of the inverting elements 120 and 130 is set to an intermediate value between a voltages of a low level and a high level, a time required for transition from input signals (IN, INB) to output signals (OUT1, OUT2) corresponds to (1.5*unit time) in case of the first process, (4.5*unit time) in case of the second process, and (7.5*unit time) in case of the third process. Difference between the times required in cases of the first and third processes, corresponds to (6*unit time), which means that the performance of the signal amplification circuit becomes sensitive to the process.

Second waveform diagram 420 illustrates the waveforms of the amplified signals OUT and OUTB, the output signals OUT1 and OUT2, illustrating a concern raised by a delay difference based on a drivability difference between NMOS and PMOS transistors. It is supposed that there is only the delay difference based on the drivability difference between the NMOS and PMOS transistors, and that a time required for each transistor to completely drive a node is set to (2*unit time) for the NMOS transistor, and (4*unit time) for the PMOS transistor.

In response to the transition of the input signal IN from a low level to a high level, the differential amplification unit 110 outputs a low-level signal with the output node D of the 1st amplifier 210 pull-up driven by the PMOS transistor P2, and the output node F of the 1st inverting element 120 pull-down driven by the NMOS transistor N3. In the similar way, the differential amplification unit 110 outputs a high-level signal because the 2nd amplifier 210 and the 2nd inverting element 130 are driven in the opposite manner.

Therefore, the 1st amplifier 210 requires a driving time of (4*unit time), and the 1st inverting element 120 requires a driving time of (2*unit time). Accordingly, (5*unit time) is required for completely driving the output of the 1st inverting element 120.

Similarly, the 2nd amplifier 220 requires a driving time of (2*unit time), and the 2nd inverting element 130 requires a driving time of (4*unit time). Accordingly, (4*unit time) is required for completely driving the output of the 2nd inverting element 130.

Since the input signals IN and INB are differential signals, the outputs OUT1 and OUT2 of the inverting elements 120 and 130 have the inversion relation. According to the above-described configuration, however, the time point between when the logic value of the output OUT1 changes and when the logic value of the output OUT2 changes differs from each other.

In addition, the relation between the outputs OUT1 and OUT2 of the 1st and 2nd inverting elements may be distorted because of path difference of input signals IN and INB to the 1st and 2nd amplifiers 210 and 220.

Due to the above-described concerns a duty ratio of output signal outputted from the signal amplification circuit may be distorted, and the relation between two output signals outputted from the signal amplification circuit may be distorted.

SUMMARY

Exemplary embodiments of the present invention are directed to a signal amplification circuit and method that averages amplified signals of a differential amplification unit and an inverting element by cross-coupling outputs of the differential amplification units and the inverting elements. Therefore, it may be possible to reduce signal duty ratio distortion caused by difference of processes, drivability of transistors, and paths of input signals, and to prevent the distortion of relation between two output signals from the signal amplification circuits.

In accordance with an embodiment of the present invention, a signal amplification circuit may include a differential amplification unit configured to differentially amplify an input signal and an input signal bar obtained by inverting the input signal, to output an amplified signal to a first node, and to output an amplified signal bar to a second node, a first inverting element configured to output a first logic value to a first output node when the level of the amplified signal is higher than a logic threshold, and to output a second logic value to the first output node when the level of the amplified signal is lower than the logic threshold, a second inverting element configured to output the first logic value to a second output node when the level of the amplified signal bar is higher than the logic threshold, and to output the second logic value to the second output node when the level of the amplified signal bar is lower than the logic threshold, a first current path connected between the first node and the second output node and a second current path connected between the second node and the first output node.

In accordance with another embodiment of the present invention, a signal amplification circuit may include a differential amplification unit configured to differentially amplify an input signal and an input signal bar obtained by inverting the input signal, and generate an amplified signal and an amplified signal bar, a first inverting element configured to output a first logic value when the level of the amplified signal is higher than a logic threshold, and output a second logic value when the level of the amplified signal is lower than the logic threshold, a second inverting element configured to output the first logic value when the level of the amplified signal bar is higher than the logic threshold, and output the second logic value when the level of the amplified signal bar is lower than the logic threshold, a first averaging element configured to average the amplified signal and an output of the second inverting element and a second averaging element configured to average the amplified signal bar and an output of the first inverting element.

In accordance with yet another embodiment of the present invention, a signal amplification method may include generating an amplified signal and an amplified signal bar by differentially amplifying an input signal and an input signal bar obtained by inverting the input signal; generating a first output signal having a first logic value when the level of the amplified signal is higher than a logic threshold and a second logic value when the level of the amplified signal is lower than the logic threshold, and a second output signal having the first logic value when the level of the amplified signal bar is higher than the logic threshold and the second logic value when the level of the amplified signal bar is lower than the logic threshold; and averaging the amplified signal and the second output signal, and averaging the amplified signal bar and the first output signal.

In accordance with yet another embodiment of the present invention, a signal amplification circuit including a differential amplification unit configured to output an output signal and an output signal bar; a first inverting element configured to output one of logic values according to the level of the output signal; a second inverting element configured to output one of logic values according to the level of the output signal bar; and a current path configured to cross-couple the first and second inverting elements.

BRIEF DESCRIPTION OF THE DRAWINGS

FIGS. 9 to 13 are diagrams illustrating simulation results showing the effect of the signal amplification circuit in accordance with the embodiment of the present invention.

DETAILED DESCRIPTION

Figure 1:
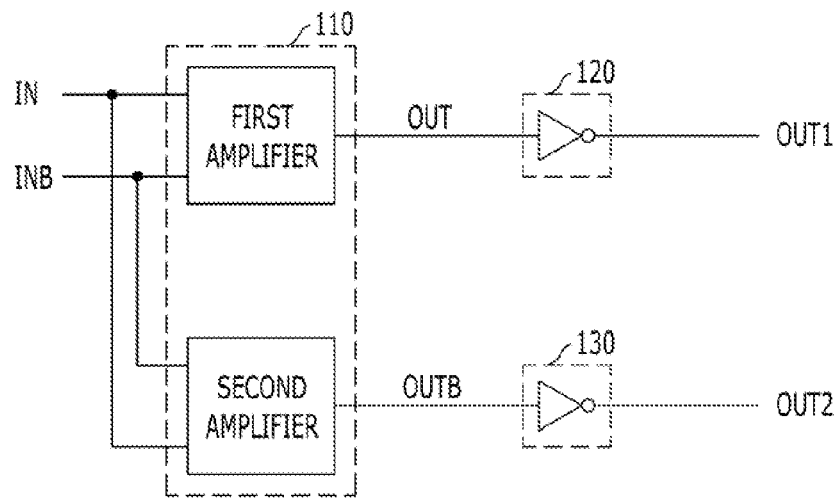
FIG. 1 is a configuration diagram illustrating a conventional signal amplification circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 5:
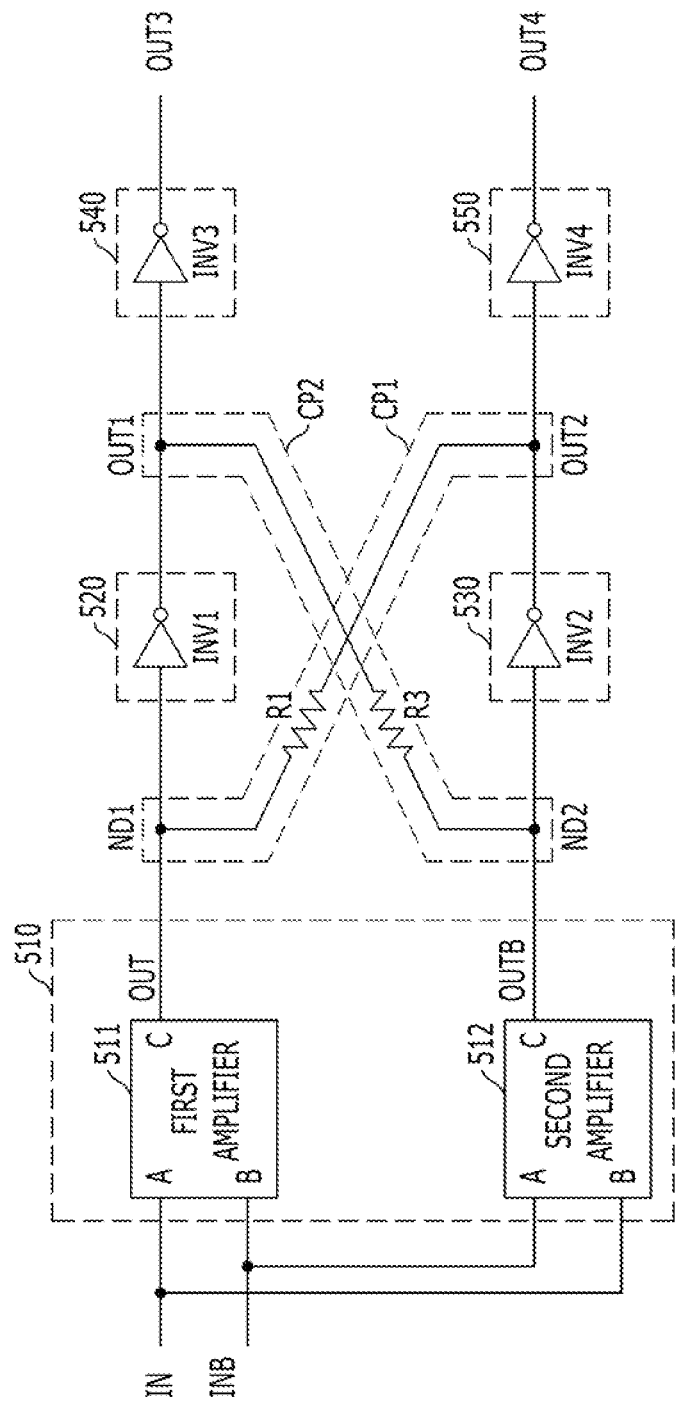
FIG. 5 is a configuration diagram illustrating a signal amplification circuit in accordance with an embodiment of the present invention.

FIG. 5 is a configuration diagram of a signal amplification circuit in accordance with an embodiment of the present invention.

Referring to FIG. 5, the signal amplification circuit includes a differential amplification unit 510, a first (1st) inverting element 520, a second (2nd) inverting element 530, a first current path CP1, and a second current path CP2. The differential amplification unit 510 is configured to differentially amplify an input signals IN and INB, outputs amplified signals OUT and OUTB respectively to 1st and 2nd nodes ND1 and ND2. The 1st inverting element 520 is configured to output first logic value to the 1st output node OUT1 when the level of the amplified signal OUT is higher than a logic threshold LT and second logic value when the level of the amplified signal OUT is lower than the logic threshold LT. The 2nd inverting element 530 is configured to output the first logic value to the 2nd output node OUT2 to when the level of the amplified signal bar OUTB is higher than the logic threshold LT and the second logic value when the level of the amplified signal bar OUTB is lower than the logic threshold LT. The 1st current path CP1 is connected between the 1st node ND1 and the 2nd output node OUT2. The 2nd current path CP2 is connected between the 2nd node ND2 and the 1st output node OUT1.

The differential amplification unit 510 generates the amplified signals OUT and OUTB by amplifying a voltage difference between the input signals IN and INB, wherein the input signal bar INB is obtained by inverting the input signal IN. The amplified signal OUT corresponds to the input signal IN, and the amplified signal bar OUTB corresponds to the input signal bar INB. When the differential amplification unit 510 ideally operates so as not to delay a signal, the amplified signals OUT and OUTB may respectively have the same phase as the input signals IN and INB. In a fully-differential input method which uses the input signals IN and INB, the input signals IN and INB have a symmetric waveform, and thus the amplified signals OUT and OUTB also have a symmetric waveform.

The differential amplification unit 510 may include a one or more-stages amplification unit to generate the amplified signals OUT and OUTB. The two or more-stages amplification has two or more amplification units connected in series. The later-stage amplification unit may amplify the received output of the earlier-stage amplification unit to acquire a sufficient gain.

Figure 2:
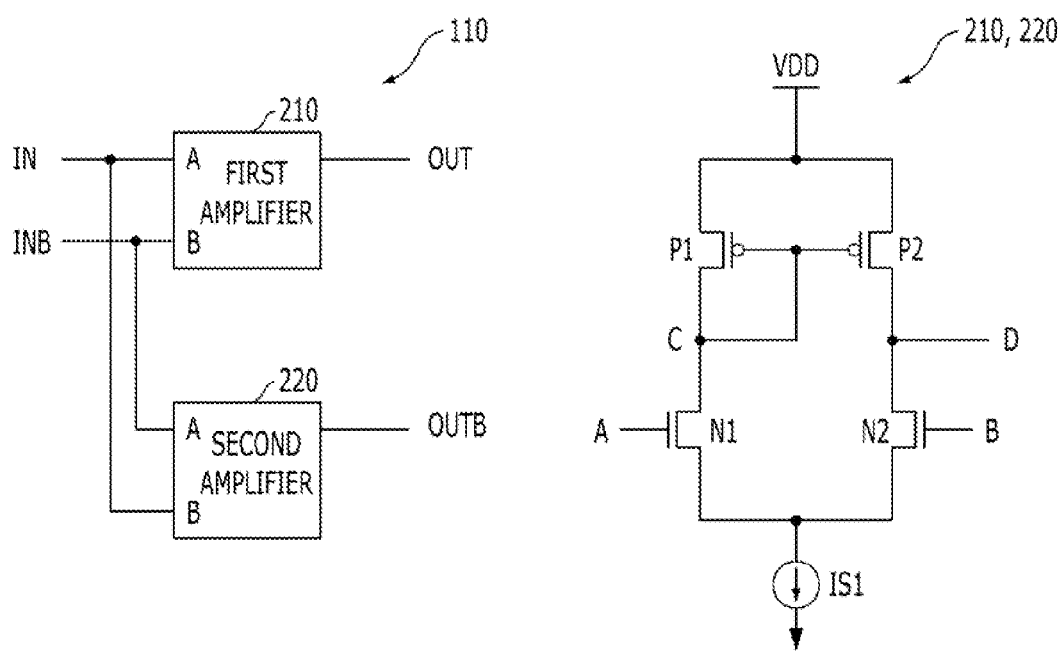
FIG. 2 is a configuration diagram illustrating a differential to amplification unit.
Figure 8:
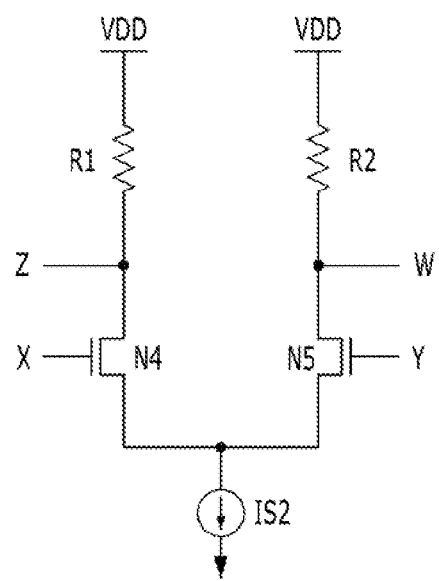
FIG. 8 is a configuration diagram illustrating a differential-to-differential amplifier.

The each stage amplification unit may include a differential-to-differential amplifier amplifying a voltage difference between the received differential signals to output differential signals. Alternatively, the each stage amplification unit may include two differential-to-single-ended amplifiers amplifying a voltage difference between the received differential signals to output a single-ended signal. In the latter case, one differential-to-single-ended amplifier generates the amplified signal OUT, and the other differential-to-single-ended amplifier generates the amplified signal bar OUTB. The differential-to-single-ended amplifier may have the same configuration as shown in FIG. 2. The differential-to-differential amplifier may be configured as illustrated in FIG. 8.

In FIG. 5, the differential amplification unit 510 is configured with an one-stage amplification unit, and includes 1st and 2nd amplifiers 511 and 512. The 1st amplifier 511 is configured to differentially amplify the input signals IN and INB and outputs the amplified signal OUT to the 1st node ND1. The 2nd amplifier 512 is configured to differentially amplify the input signals IN and INB and outputs the amplified signal bar OUTB to the 2nd node ND2. The configuration and operation of the 1st and 2nd amplifiers 511 and 512 may be the same as those described with reference to FIGS. 2 and 4. The configuration of the differential amplifiers 511 and 512 is not limited thereto, but any amplifiers may be applied as long as they can receive differential signals, amplify a voltage difference between the differential signals, and generate an amplified signal.

The 1st inverting element 520 outputs a first value when the level of the amplified signal OUT is higher than the logic threshold LT, and it outputs a second value when the level of the amplified signal OUT is lower than the logic threshold LT. The 2nd inverting element 530 outputs the first value when the level of the amplified signal bar OUTB is higher than the logic threshold LT and the second value when the level of the amplified signal bar OUTB is lower than the logic threshold LT. The first and the second values are the inverted version of each other. Hereafter, a case in which the first value corresponds to a low level and the second value corresponds to a high level will be taken here as an example for description.

The 1st inverting element 520 may include a 1st inverting element INV1 connected to the 1st node ND1 and the 1st output node OUT1, and the 2nd inverting element 530 may include a 2nd inverting element INV2 connected to the 2nd node ND2 and the 2nd output node OUT2. The 1st inverting element 520 pull-down drives the 1st output node OUT1 when the level of the amplified signal OUT is higher than the logic threshold LT, and pull-up drives the 1st output node OUT1 when the level of the amplified signal OUT is lower than the logic threshold LT. The 2nd inverting element 530 pull-down drives the 2nd output node OUT2 when the level of the amplified signal bar OUTB is higher than the logic threshold LT, and pull-up drives the 2nd output node OUT2 when the level of the amplified signal bar OUTB is lower than the logic threshold LT.

Figure 3:
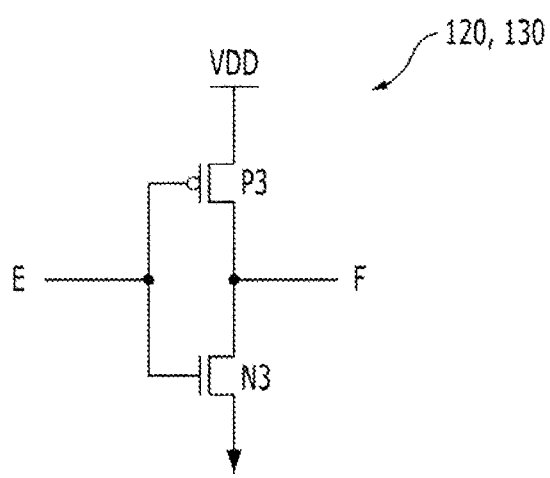
FIG. 3 is a configuration diagram illustrating inverting elements.

When the inverting elements 520 and 530 include inverters, the configuration and operation of the inverting elements are the same as those described with reference to FIGS. 3 and 4. However, the configuration of the amplifiers 511 and 512 is not limited thereto, and any inverting elements may be applied as long as they can output a low-level signal when the level of an input signal is higher than a logic threshold and output a high-level signal when the level of the input signal is lower than the logic threshold.

The 1st current path CP1 serves to pass a current between the 1st node ND1 and the 2nd output node OUT2. The 1st current path CP1 may include a 1st resistive element R1. As a current is passed by the 1st current path CP1, a signal generated from the 1st node ND1 and a signal generated from the 2nd output node OUT2 are averaged.

The 2nd current path CP2 serves to pass a current between the 2nd node ND2 and the 1st output node OUT1. The 2nd current path CP2 may include a 2nd resistive element R2. As a current is passed by the 2nd current path CP2, a signal generated from the 2nd node ND2 and a signal generated from the 1st output node OUT1 are averaged. The effect of the averaging will be described with reference to FIG. 6.

The output nodes OUT1 and OUT2 of the 1st and 2nd inverting elements are connected to 3rd and 4th inverting elements 540 and 550, respectively. The 3rd and 4th inverting elements 540 and 550 may include 3rd and 4th inverters INV3 and INV4, respectively. An output OUT3 of the 3rd inverting element has a phase obtained by delaying the input signal IN, and an output OUT4 of the 4th inverting element has a phase obtained by delaying the input signal bar INB.

As can be seen from FIG. 5, the 1st and 2nd current paths CP1 and CP2 are cross-coupled. Such a connection is referred to as cross-coupling.

The amplified signals OUT and OUTB from the differential amplification unit 510 correspond to analog signals of which the levels have a meaning, but the amplified signals from the inverting elements 520 and 530 correspond to digital signals which have a meaning depending on whether the signal level is lower or higher than the logic threshold LT. Therefore, in accordance with the embodiment of the present invention, the signals are averaged at the point where the analog signals are converted into the digital signals, which makes it possible to minimize the signal distortion in the digital signal region.

Figure 6:
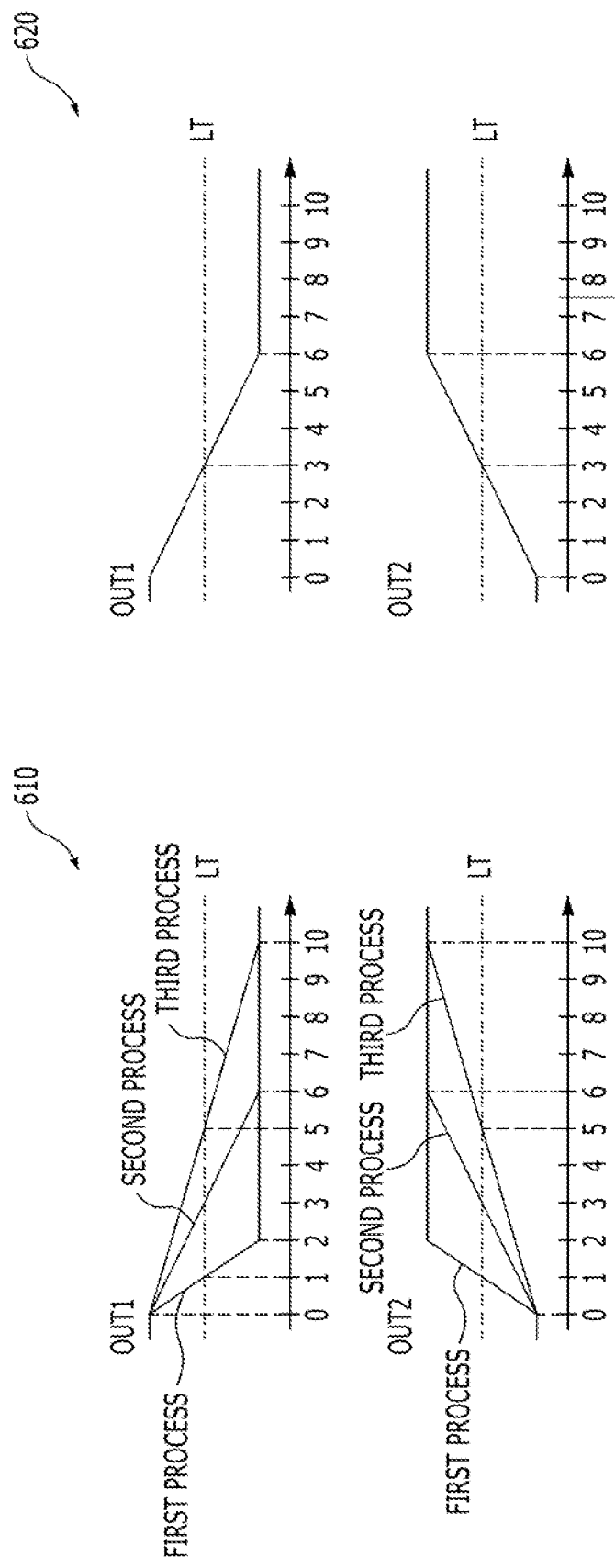
FIG. 6 is a waveform diagram for explaining the operation of the signal amplification circuit in accordance with the embodiment of the present invention.

FIG. 6 is a waveform diagram showing the operation of the signal amplification circuit in accordance with the embodiment of the present invention.

Figure 4:
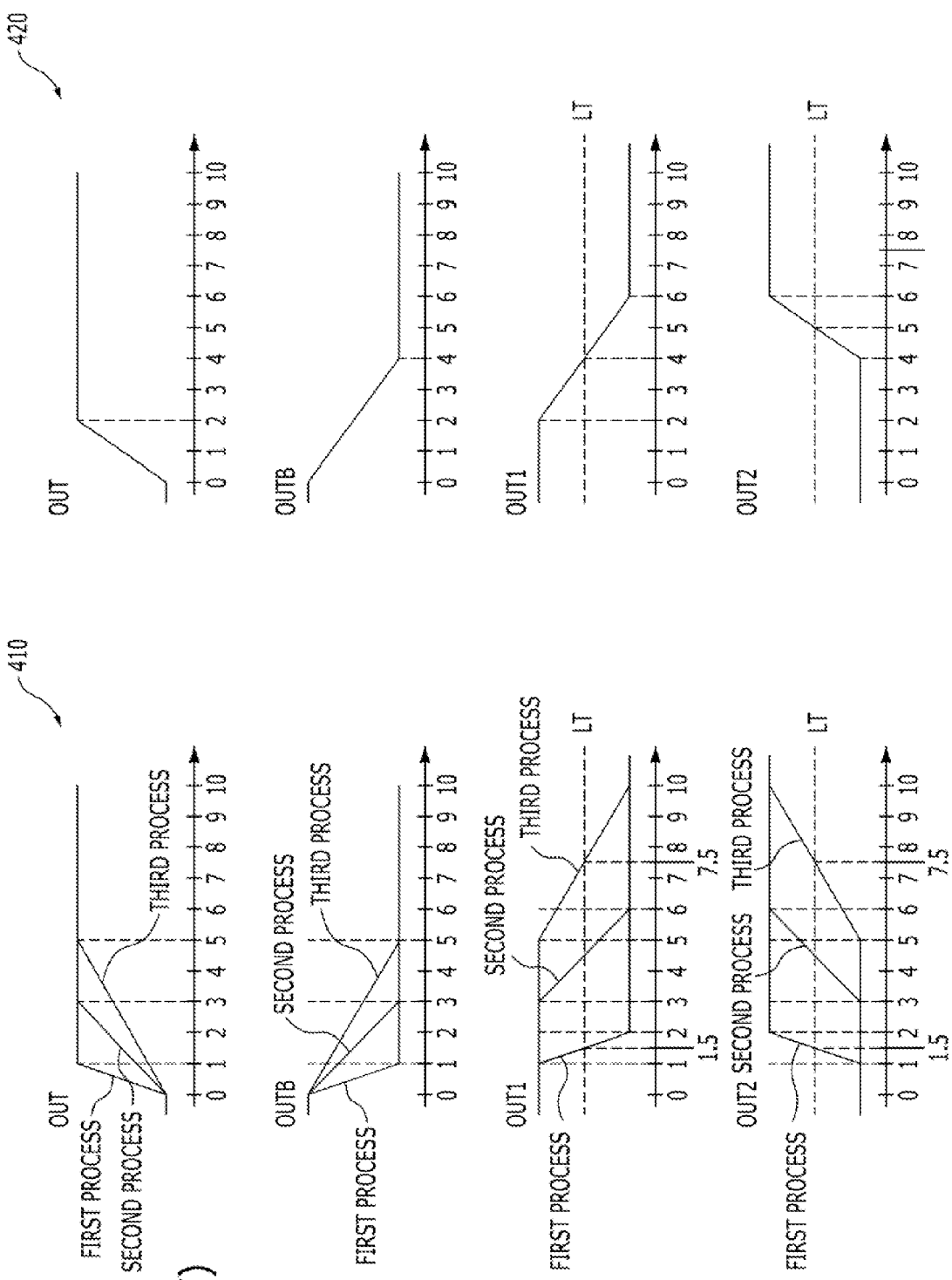
FIG. 4 is a waveform diagram illustrating the concerns related to the conventional signal amplification circuit.

In FIG. 6, the first waveform diagram 610 illustrates the waveforms of the outputs OUT1 and OUT2 of the 1st and 2nd inverting elements showing how a concern raised by a delay difference between fabrication processes disclosed in FIG. 4 is resolved. It is supposed that there is only difference in delay among the fabrication processes, and that there are three fabrication processes, and that a time required for each transistor to completely drive a node is set to (1*unit time) for the first process, (3*unit time) for the second process, and (5*unit time) for the third process.

In response to the transition of the input signal IN from a low level to a high level, the differential amplification unit 510 outputs a low level signal with the output node OUT of the 1st amplifier 511 pull-up driven by the PMOS transistor P2, and the output node OUT1 of the 1st inverting element 520 pull-down driven by the NMOS transistor N3. In the similar way, the differential amplification unit 512 outputs a high-level signal because the 2nd amplifier 512 and the 2nd inverting element 530 are driven in the opposite manner.

In response to change of the voltage of the 1st node ND1 according to transition of the input signals IN and INB, current is passed by the 1st current path CP1, which cause the voltage of the 2nd output node OUT2 to change. In response to change of the voltage of the 2nd node ND2 according to transition of the input signals IN and INB, current is passed by the 2nd current path CP2, which cause the voltage of the 1st output node OUT1 to change. Therefore, the voltages of the 1st and 2nd outputs OUT1 and OUT2 change from the transition time of the input signals IN and INB, and the change ends when the inverting elements 520 and 530 are completely driven.

(2*unit time) in case of the first process, (6*unit time) in case of the second process, and (10*unit time) in case of the third process is required for completely driving the output nodes OUT1 and OUT2 of the inverting elements 520 and 530, which is similar to the conventional circuit. However, when the logic threshold LT of the inverting elements 520 and 530 is set to an intermediate value between a voltage of a low level and a voltage of a high level, the time required for transition from input signals (IN, INB) to output signals (OUT1, OUT2) corresponds to (1*unit time) in case of the first process, (3*unit time) in case of the second process, and (5*unit time) in case of the third process.

The time required for transition from input signals (IN, INB) to output signals (OUT1, OUT2) is reduced more compared to the conventional circuit. Difference between the times required in cases of the first and third processes, corresponds to (4*unit time). Therefore, it may be possible to reduce duty ratio distortion caused when the outputs OUT1 and OUT2 of the inverting elements are distorted according to the difference between processes The second waveform diagram 620 illustrates the waveforms of the outputs OUT1 and OUT2 of the 1st and 2nd inverting elements showing how the concern raised by a delay difference based on a drivability difference between NMOS and PMOS transistors is solved. It is supposed that there is only the delay difference based on the drivability difference between the NMOS and PMOS transistors, and that a time required for each transistor to completely drive a node is set to (2*unit time) for the NMOS transistor, and (4*unit time) for the PMOS transistor.

In response to the transition of the input signal IN from a low level to a high level, the differential amplification unit 510 outputs a low-level signal with the output node OUT of the 1st amplifier 511 pull-up driven by the PMOS transistor P2, and the output node OUT1 of the 1st inverting element 520 pull-down driven by the NMOS transistor N3. In the similar way, the differential amplification unit 512 outputs a high-level signal because the 2nd amplifier 512 and the 2nd inverting element 530 are driven in the opposite manner.

Therefore, the 1st amplifier 511 requires a driving time of (4*unit time), and the 1st inverting element 540 requires a driving time of (2*unit time). Accordingly, (5*unit time) is required for completely driving the output of the 1st inverting element 540. (6*unit time) is required for completely driving the output OUT1 of the 1st inverting element.

Similarly, the 2nd amplifier 512 requires a driving time of (2*unit time), and the 2nd inverting element 530 requires a driving time of (4*unit time). Accordingly, (4*unit time) is required for completely driving the output of the 2nd inverting element 530. (6*unit time) is required for completely driving the output OUT2 of the 2nd inverting element.

In response to change of the voltage of the 1st node ND1 according to transition of the input signals IN and INB, current is passed by the 1st current path CP1, which cause the voltage of the 2nd output node OUT2 to change. In response to change of the voltage of the 2nd node ND2 according to transition of the input signals IN and INB, current is passed by the 2nd current path CP2, which cause the voltage of the 1st output node OUT1 to change Therefore, the voltages of the 1st and 2nd outputs OUT1 and OUT2 change from the transition time of the input signals IN and INB, and the change ends when drive of the inverting elements 520 and 530 are completed.

The times required for completely driving the output nodes OUT1 and OUT2 of the respective inverting elements 520 and 530 correspond to (6*unit time), similarly to the conventional signal amplification circuit. However, when the logic threshold LT of the inverting elements 520 and 530 is set to an intermediate value between a voltage of a low level and a high level, the time required for transition from input signals (IN, INB) to output signals (OUT1, OUT2) corresponds to (3*unit time).

The time required for transition from input signals (IN, INB) to output signals (OUT1, OUT2) is reduced more compared to conventional circuit. The times required for changing the logic values of the outputs OUT1 and OUT2 of the 1st and 2nd inverting elements 520 and 530 are equalized to each other. Therefore, it may be possible to reduce duty ratio distortion caused when the outputs OUT1 and OUT2 of the inverting elements are distorted according to the drivability difference between the NMOS and PMOS transistors.

In addition, it may be possible to resolve the concern in which the relation between the outputs OUT1 and OUT2 of the 1st and 2nd inverting elements is distorted due to difference of the paths of the input signals IN and INB to the 1st and 2nd amplifiers 511 and 512, respectively, in a similar manner.

Referring to FIGS. 5 and 6, a signal amplification circuit in accordance with another embodiment of the present invention will be described. The above descriptions have been focused on the structure in which the 1st node ND1 and the 2nd output node OUT2 are connected to each other and the 2nd node ND2 and the 1st output node OUT1 are connected to each other. However, the following descriptions will be focused on the functions of the respective components.

Referring to FIG. 5, the signal amplification circuit includes a differential amplification unit 510, a 1st inverting element 520, a 2nd inverting element 530, a 1st averaging element R1, and a 2nd averaging element R2. The differential amplification unit 510 is configured to differentially amplify an input signal IN and an input signal bar INB obtained by inverting the input signal IN and generate an amplified signal OUT and an amplified signal bar OUTB. The 1st inverting element 520 is configured to output a 1st logic value when the level of the amplified signal OUT is higher than a logic threshold LT, and output a 2nd logic value when the level of the amplified signal OUT is lower than the logic threshold LT. The 2nd inverting element 530 is configured to output a 1st logic value when the level of the amplified signal bar OUTB is higher than the logic threshold LT, and output a 2nd logic value when the level of the amplified signal bar OUTB is lower than the logic threshold LT. The 1st averaging element R1 is configured to average the amplified signal OUT and the output OUT1 of the 2nd inverting element. The 2nd averaging element R2 is configured to average the amplified signal bar OUTB and the output OUT2 of the 1st inverting element.

The 1st averaging element R1 corresponds to the 1st resistive element R2 to form the 1st current path CP1, and the 2nd averaging element R2 corresponds to the 2nd resistive element R2 to form the 2nd current path CP2. The detailed configuration and operation of the above-described signal amplification circuit are the same as those described with reference to FIGS. 5 and 6, except that the signal amplification circuit of FIG. 5 is described in terms of functions.

When two signals are averaged, the result signal has characteristic values close to the average of the two original signals. The example of the characteristic values may be phase and voltage level of a signal. For example, as a result of averaging the output signal OUT of the 1st node ND1 and the output signal OUT2 of the 2nd inverting element 530, the result signal has average values of phase and voltage level between the original values of the output signal OUT and the output signal OUT2.

Figure 7:
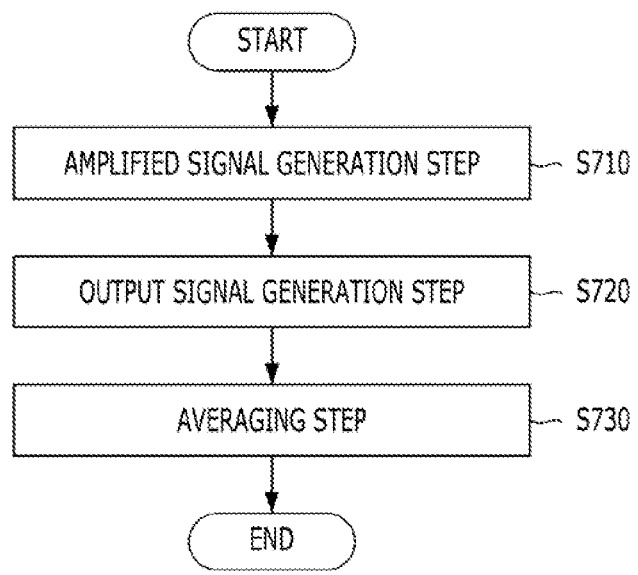
FIG. 7 is a flow chart for explaining a signal amplification method in accordance with the embodiment of the present invention.

FIG. 7 is a flow chart showing a signal amplification method in accordance with the embodiment of the present invention.

Referring to FIG. 7, the signal amplification method includes a step S710 for differentially amplifying the input signals IN and INB, thereby generating the amplified signals OUT and OUTB a step S720 for generating the 1st output signal OUT1 of the first logic value when the level of the amplified signal OUT is higher than the logic threshold LT and the second logic value when the level of the amplified signal OUT is lower than the logic threshold LT, and generating the 2nd output signal OUT2 of the first logic value when the level of the amplified signal bar OUTB is higher than the logic threshold LT and the second logic value when the level of the amplified signal bar OUTB is lower than the logic threshold LT; and a step S730 for averaging the amplified signal OUT and the 2nd output signal OUT2 and averaging the amplified signal bar OUTB and the 1st output signal OUT1.

Referring to FIGS. 5 to 7, in the step S710, the differential amplification unit 510 generates the amplified signals OUT and OUTB by amplifying a voltage difference between the input signals IN and INB. The configuration of the differential amplification unit 510 and the process in which the differential amplification unit 510 generates the amplified signals OUT and OUTB by amplifying a voltage difference between the input signal IN and the amplified signal bar INB are the same as described with reference to FIG. 5.

At the step S720, the 1st inverting element 520 generates the 1st output signal OUT1 by inverting the amplified signal OUT, and the 2nd inverting element 530 generates the 2nd output signal OUT2 by inverting the amplified signal bar OUTB. The 1st output signal OUT1 indicates a signal generated from the output node OUT1 of the 1st inverting element, and the 2nd output signal OUT2 indicates a signal generated from the output node OUT2 of the 2nd inverting element. The operations of the 1st and 2nd inverting elements 520 and 530 are performed in the same manner as described with reference to FIG. 5.

The first value may be set to a high level, and the second value may be set to a low level. On the other hand, the first value may be set to a low level, and the second value may be set to a high level. When the first value is a low level and the second value is a high level, the amplified signal generation step S720 includes a step (not shown in FIG. 7) of pull-down driving the 1st output node OUT1 when the level of the amplified signal OUT is higher than the logic threshold LT and pull-up driving the 1st output node OUT1 when the level of the amplified signal OUT is lower than the logic threshold LT and a step (not shown in FIG. 7) of pull-down driving the 2nd output node OUT2 when the level of the amplified signal bar OUTB is higher than the logic threshold LT and pull-up driving the 2nd output node OUT2 when the level of the amplified signal bar OUTB is lower than the logic threshold LT.

At the step S730, a current is passed between the 1st node ND1 and the 2nd output node OUT2 of the 2nd inverting element by the 1st current path CP1 (or the averaging element R1) so as to average the amplified signal OUT and the 2nd output signal OUT2, and a current is passed between the 2nd node ND2 and the 1st output node OUT1 of the 1st inverting element by the 2nd current path CP2 (or the 2nd averaging element R2) so as to average the amplified signal bar OUTB and the 1st output signal OUT1.

For reference, the amplified signal generation step S710 the amplified signal generation step S720, and the averaging step S730 may not be sequentially performed, but may overlap each other. That is, the respective steps may be simultaneously performed.

FIG. 8 is a configuration diagram of a differential-to-differential amplifier.

Referring to FIG. 8, the differential-to-differential amplifier includes two resistive elements R1 and R2, two NMOS transistors N4 and N5, and a current source IS2. The two NMOS transistors N4 and N5 receive a power supply voltage VDD, and the resistive elements R1 and R2 have the same resistance value. The sum of amounts of currents flowing in the NMOS transistors N4 and N5 is constantly maintained by the current source IS2.

The operation of the amplifier is performed as follows. When the voltage of a terminal X is higher than the voltage of a terminal Y, the amount of current flowing in the NMOS transistor N4 is larger than the amount of current flowing in the NMOS transistor N5. Therefore, a voltage drop caused by the resistive element R1 becomes larger than a voltage drop caused by the resistance element R2 such that a signal having a relatively-low level is generated from a node Z and a signal having a relatively-high level is generated from a node W. On the other hand, when the voltage of the terminal Y is higher than the voltage of the terminal X, the amount of current flowing in the NMOS transistor N5 is larger than the amount of current flowing in the NMOS transistor N4. Therefore, a voltage drop caused by the resistive element R2 becomes larger than a voltage drop caused by the resistive element R1 such that a signal having a relatively-high level is generated from the node Z and a signal having a relatively-low level is generated form the node W.

The differential amplifier 510 of FIG. 5 may include the differential-to-differential amplifier of FIG. 8. When the differential amplifier 510 of FIG. 5 is the differential-to-differential amplifier of FIG. 8, the differential amplifier 510 receives the input signals IN and INB through the terminal X and the terminal Y, respectively, and outputs the amplified signal bar OUTB and the amplified signal OUT to the node Z and the node W, respectively.

FIGS. 9 to 13 are diagrams illustrating simulation results showing the effect of the signal amplification circuit in accordance with the embodiment of the present invention.

Figure 10A:
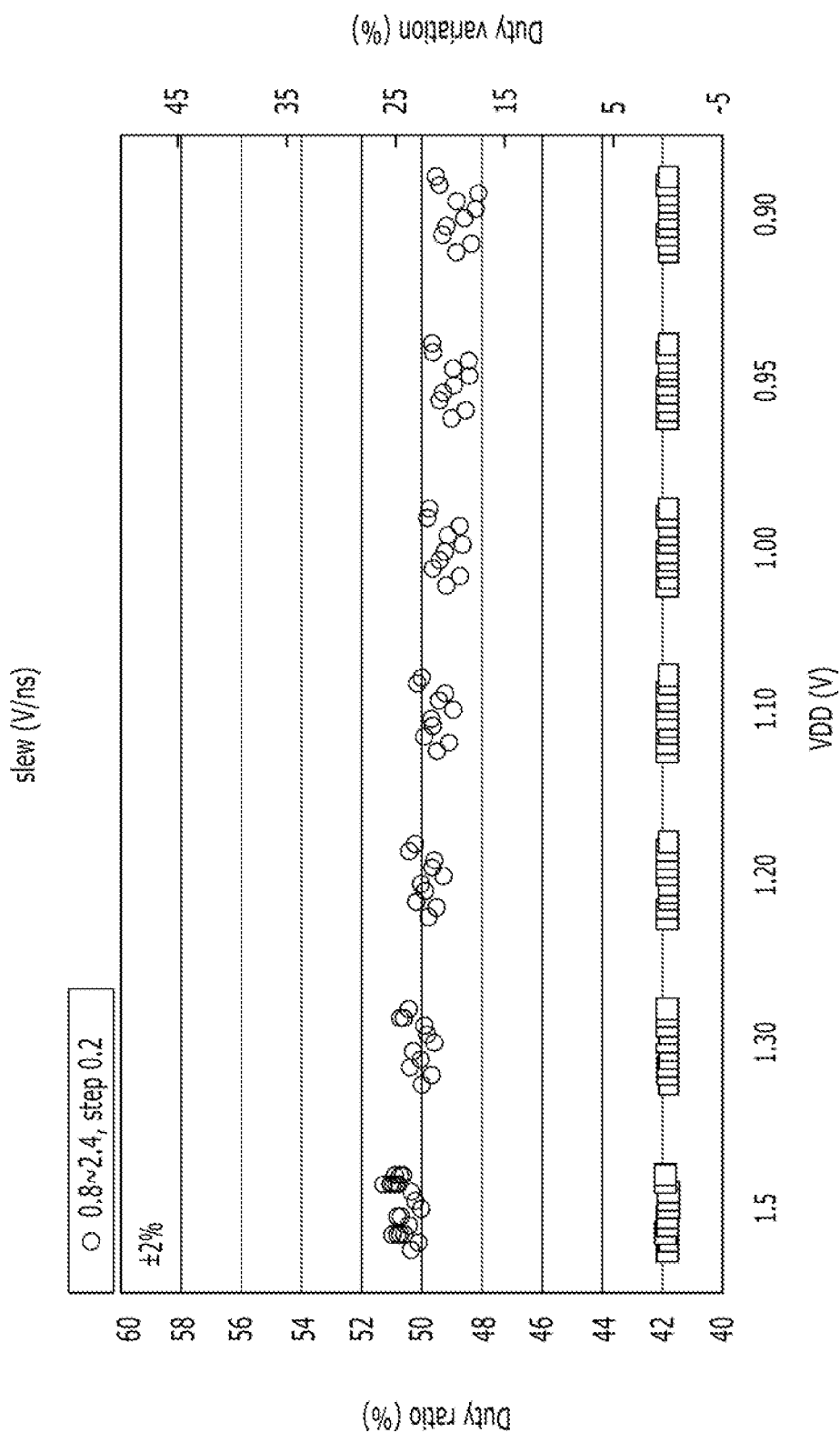
Figure 10B:
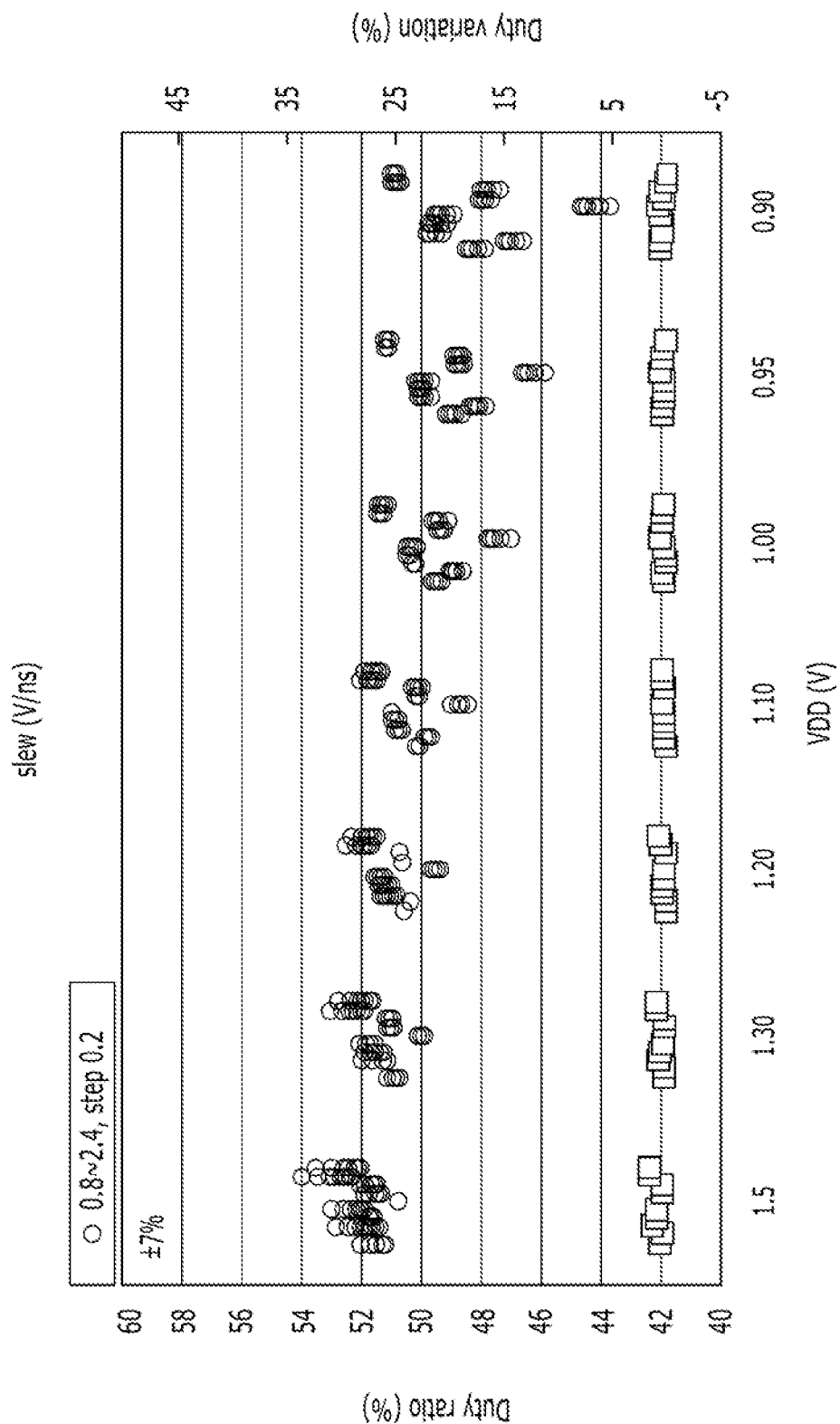

FIGS. 10A and 10B respectively show one simulation result of the present invention and the prior art. FIGS. 10A and 10B illustrate distributions of duty ratios and duty variations at different levels of power supply voltages VDD when the slew rate of signals varies from 0.8 V/ns to 2.4 V/ns with interval of 0.2 V/ns. In FIGS. 10A and 10B, a circular distribution indicates a duty ratio distribution, and a rectangular distribution indicates a duty variation distribution. Referring to FIGS. 10A and 10B the maximum values of the duty variation in accordance with the present invention and the prior art are respectively about 2% and about 7%. The duty variation in accordance with the present invention is much smaller than that according to the prior art. 1st diagram 910 of FIG. 9 illustrates change of the slew rate of signals in the simulations of FIGS. 10A and 10B.

Figure 11A:
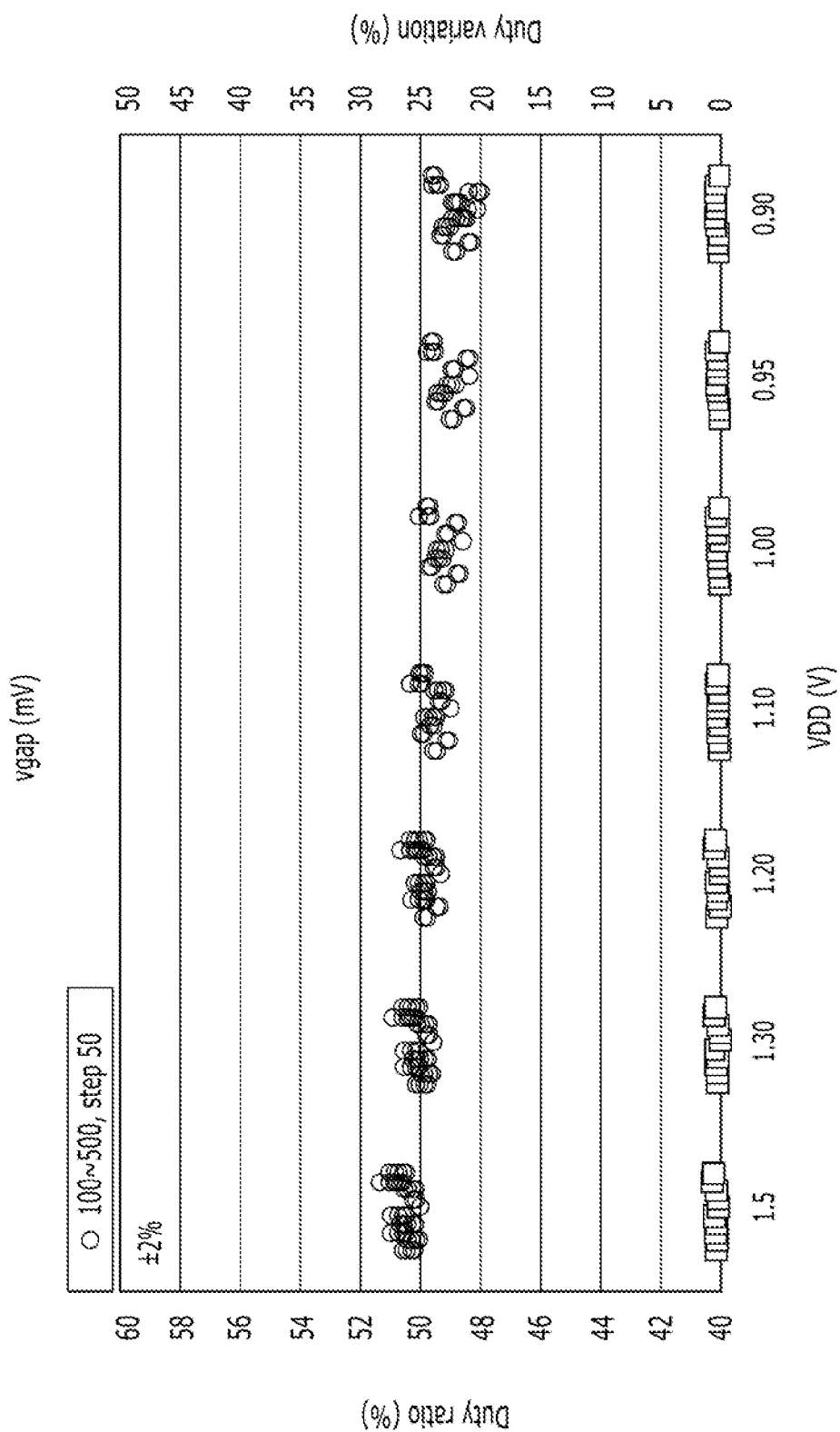
Figure 11B:
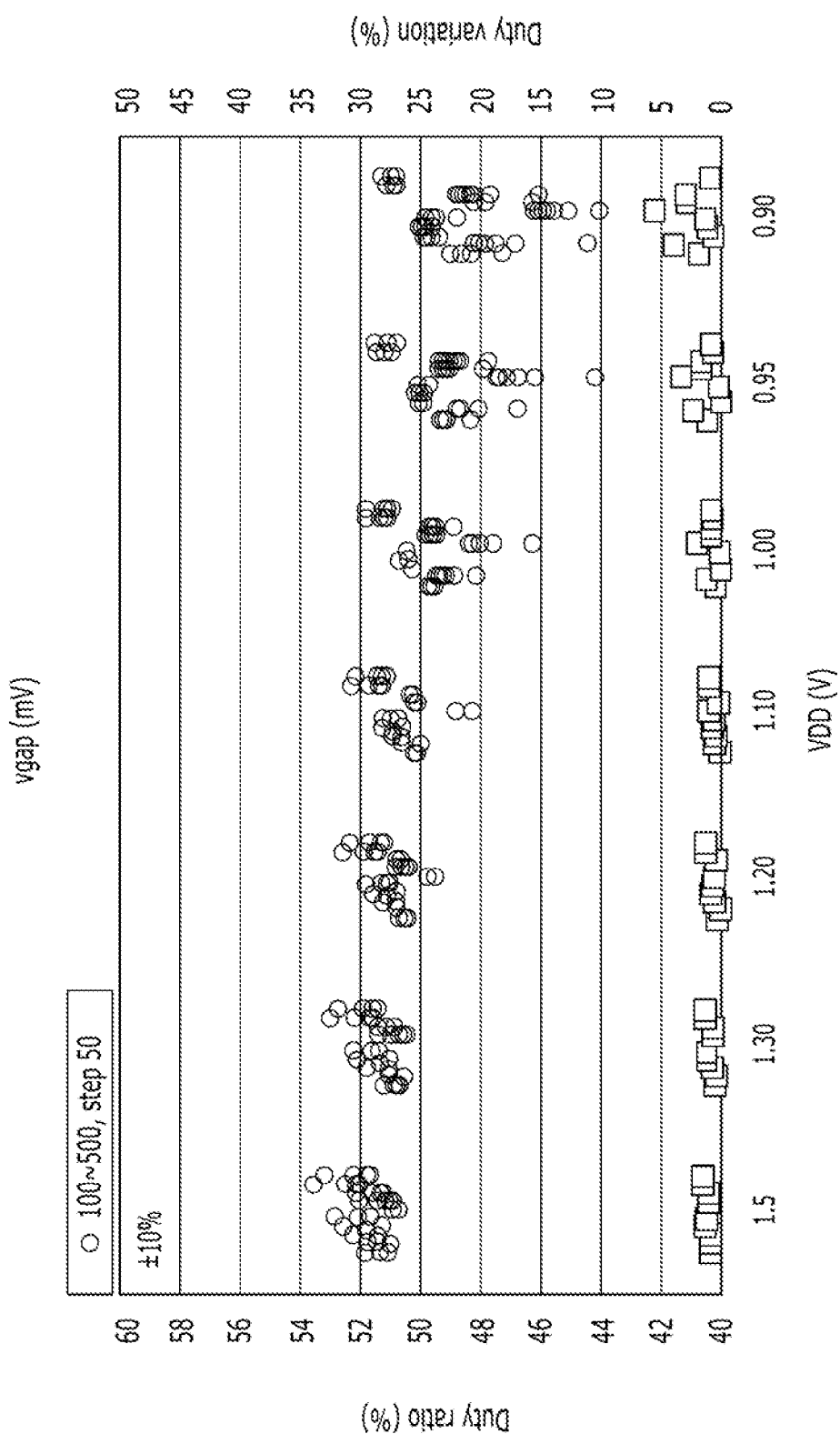

FIGS. 11A and 11B respectively show another simulation result of the present invention and the prior art. FIGS. 11A and 11B illustrate distributions of duty ratios and duty variations at different levels of power supply voltages VDD when a voltage gap VGAP of a signal varies from 100 mV to 500 mV with interval of 50 mV. The voltage gap VGAP indicates a difference between the maximum and the minimum values of the voltage of the signal. In FIGS. 11A and 11B, a circular distribution indicates a duty ratio distribution, and a rectangular distribution indicates a duty variation distribution. Referring to FIGS. 11A and 11B, the maximum values of the duty variation in accordance with the present invention and the prior art to are respectively about 2% and about 10%. The duty variation in accordance with the present invention is much smaller than that according to the prior art. 2nd diagram 920 of FIG. 9 illustrates change of the voltage gap VGAP of the signal in the simulations of FIGS. 11A and 11B.

Figure 12A:
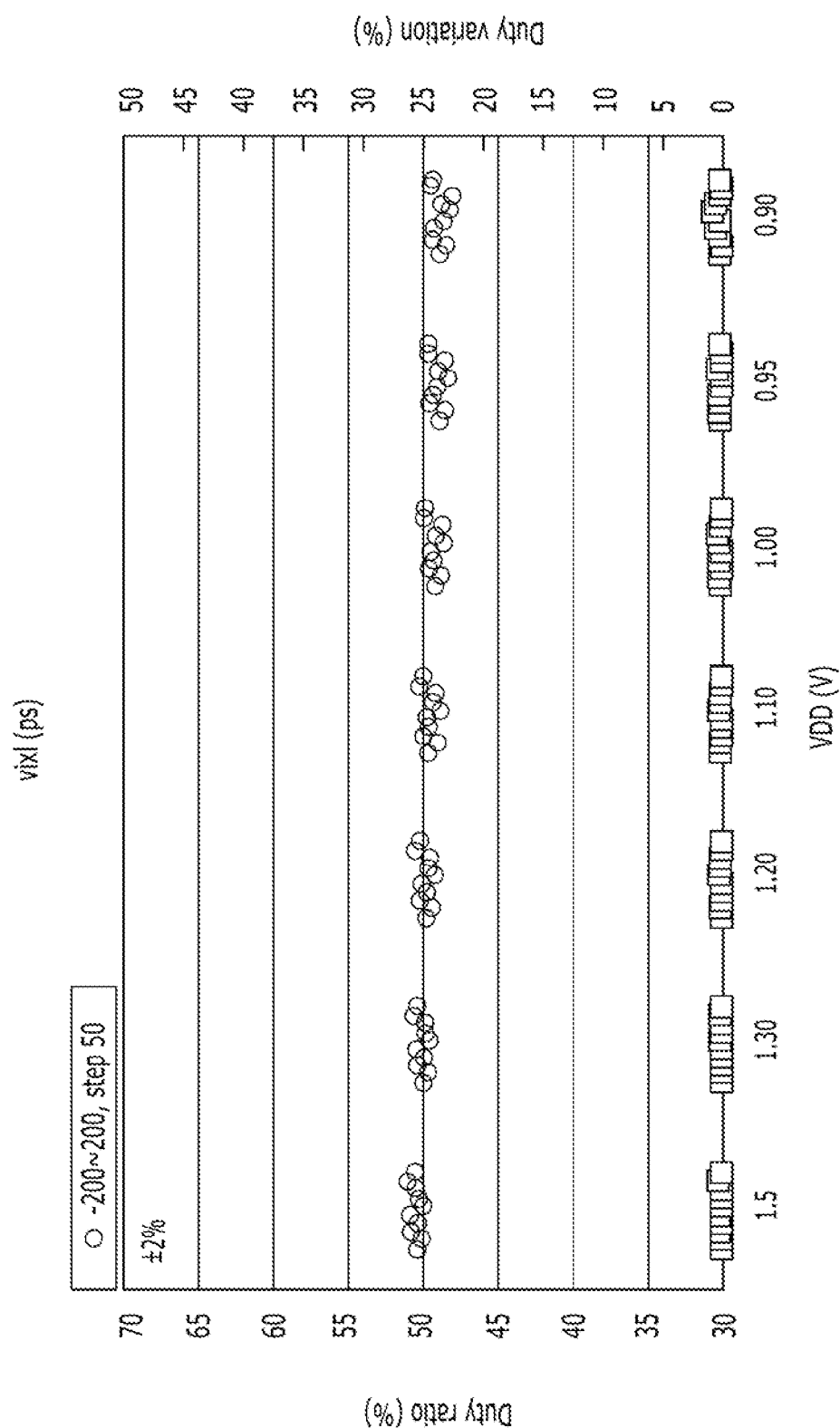
Figure 12B:
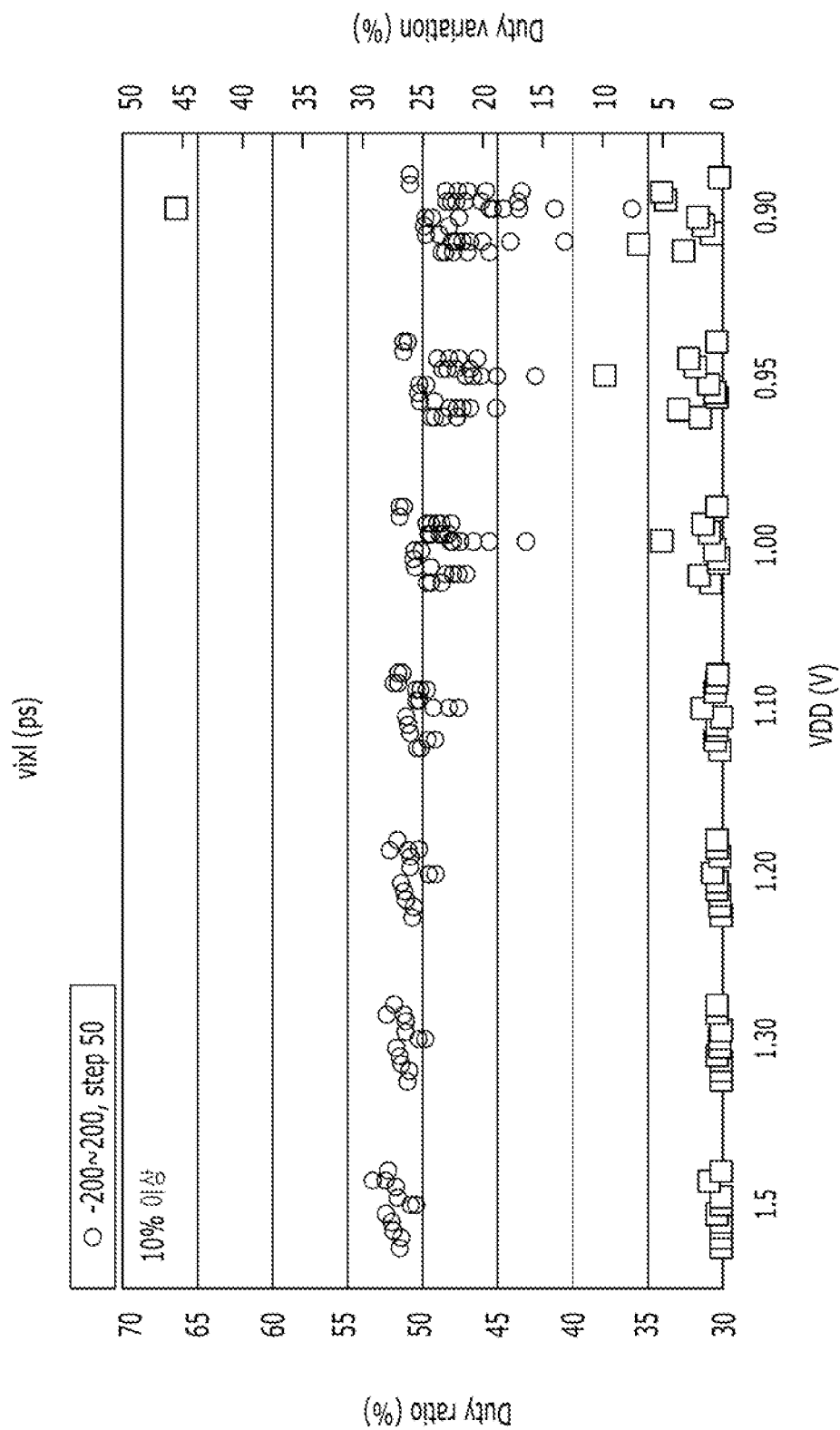

FIGS. 12A and 12B respectively show another simulation result of the present invention and the prior art. FIGS. 12A and 12B illustrate distributions of duty ratios and duty variations at different levels of power supply voltages VDD when VIXL of a signal varies from ~200 mV to 200 mV with interval of 50 mV. The VIXL represents an average voltage level of a signal. In FIGS. 12A and 12B, a circular distribution indicates a duty ratio distribution, and a rectangular distribution indicates a duty variation distribution. Referring to FIGS. 12A and 12B, the maximum values of the duty variation in accordance with the present invention and the prior art are respectively about 2% and abut 10%. The duty variation in accordance with the present invention is much smaller than that according to the prior art. 3rd diagram 930 of FIG. 9 illustrates change of the VIXL of the signal in the simulations of FIGS. 12A and 12B.

Figure 13A:
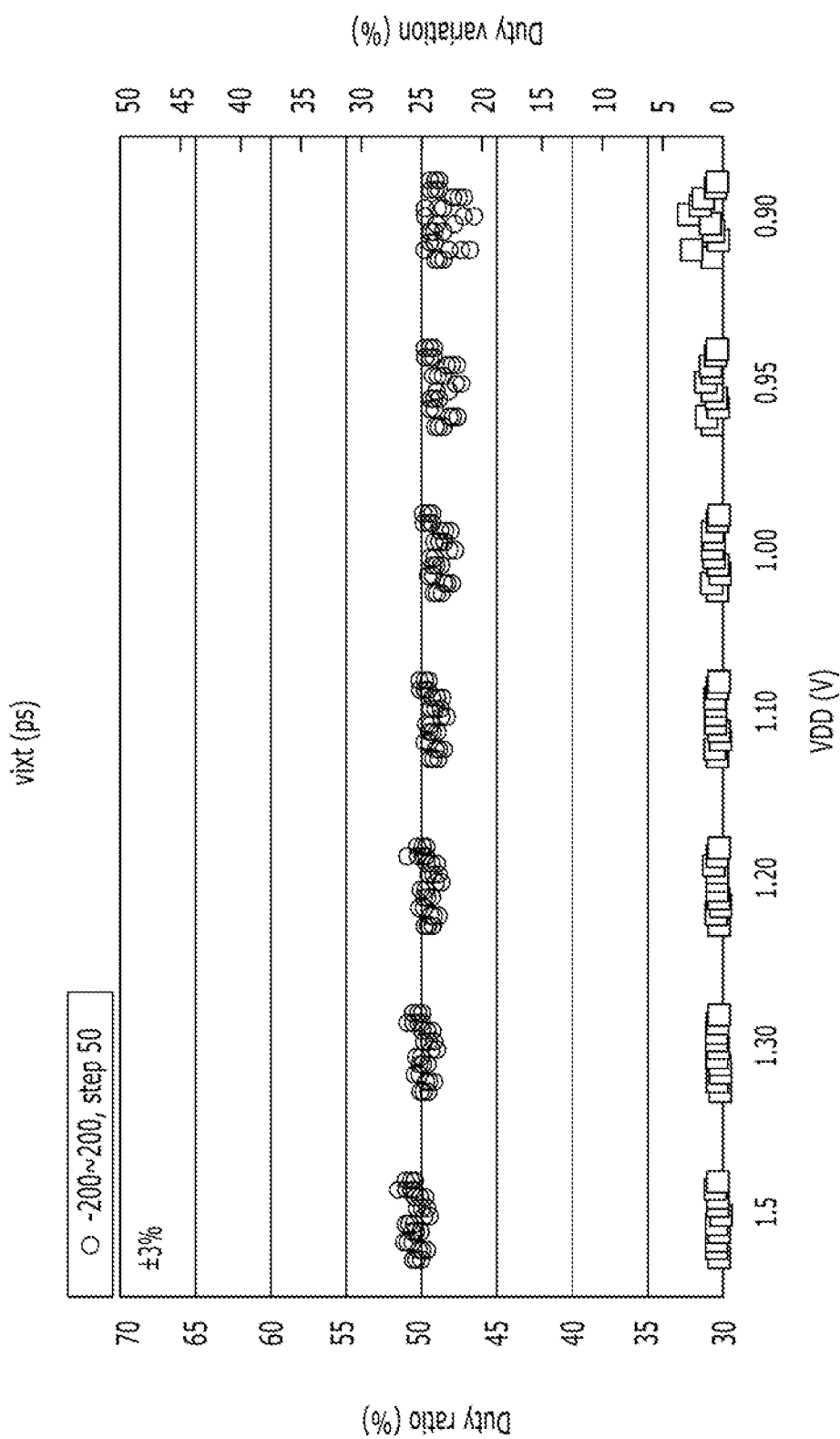
Figure 13B:
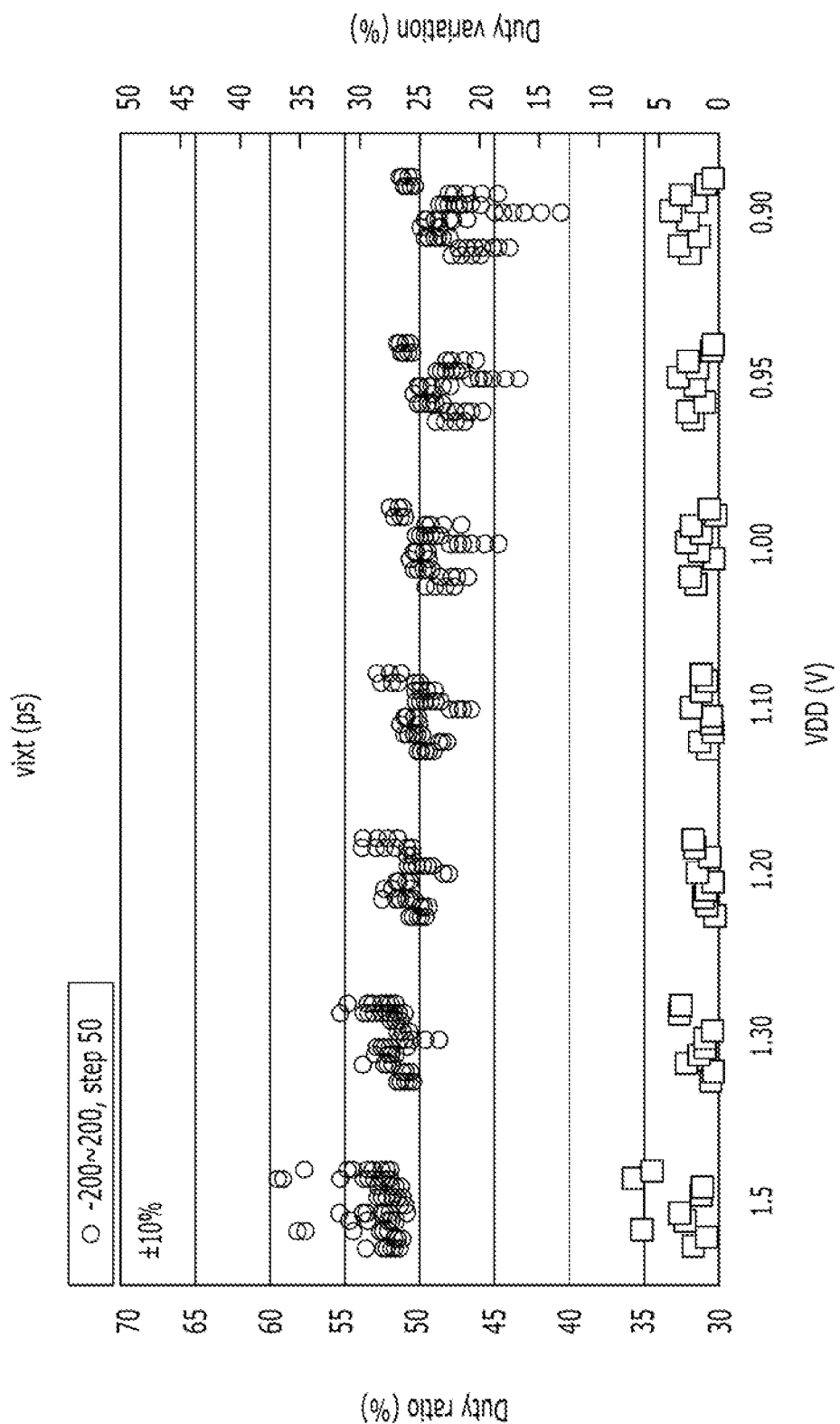

FIGS. 13A and 13B respectively show another simulation result of the present invention and the prior art. FIGS. 13A and 13B illustrate distributions of duty ratios and duty variations at differential levels of power supply voltages VDD when VIXT of a signal varies from ~200 ps to 200 ps with interval of 50 ps. The VIXT indicates a time when a signal passes through an average voltage level. In FIGS. 13A and 13B, a circular distribution indicates a duty ratio distribution, and a rectangular distribution indicates a duty variation distribution. Referring to FIGS. 13A and 13B, the maximum values of the duty variation in accordance with the present invention and the prior art are respectively about 2% and about 10%. The duty variation in accordance with the present invention is much smaller than that according to the prior art. 3rd diagram 940 of FIG. 9 illustrates change of the VIXL of the signal in the simulations of FIGS. 13A and 13B.

In addition, the signal amplification circuit in accordance with the embodiment of the present invention has an effect that the change of an amplified signal delayed from an input signal based on PVT conditions, that is, the delay variation based on PVT conditions is much smaller compared to the conventional signal amplification circuit.

In accordance with the embodiments of the present invention, the outputs of the differential amplification units and the output nodes of the inverting elements are cross-coupled to average the amplified signals of the differential amplification units and the amplified signals of the inverting elements, thereby reducing the signal duty ratio distortion caused by a process difference, a drivability difference between NMOS and PMOS transistors, and a length difference between the paths of input signals and preventing the distortion of relation between two signals outputted from the signal amplification circuits.

While the present invention has been described with respect to the specific embodiments, it will be apparent to those skilled in the art that various changes and modifications may be made without departing from the spirit and scope of the invention as defined in the following claims.

What is claimed is:
1. A signal amplification circuit comprising:
a differential amplification unit configured to differentially amplify an input signal and an input signal bar obtained by inverting the input signal, to output an amplified signal to a first node, and to output an amplified signal bar to a second node;

a first inverting element configured to output a first logic value to a first output node when the level of the amplified signal is higher than a logic threshold, and to output a second logic value to the first output node when the level of the amplified signal is lower than the logic threshold;

a second inverting element configured to output the first logic value to a second output node when the level of the amplified signal bar is higher than the logic threshold, and to output the second logic value to the second output node when the level of the amplified signal bar is lower than the logic threshold;

a first current path connected between the first node and the second output node; and a second current path connected between the second node and the first output node, wherein the first current path includes a first resistive element connected between the first node and the second output node, and the second current path includes a second resistive element connected between the second node and the first output node.

2. The signal amplification circuit of claim 1, wherein the differential amplification unit comprises:

a first amplifier configured to output the amplified signal to the first node by differentially amplifying the input signal and the input signal bar; and a second amplifier configured to output the amplified signal bar to the second node by differentially amplifying the input signal and the input signal bar.

3. The signal amplification circuit of claim 1, wherein the first inverting element includes a first inverter connected between the first node and the first output node, and the second inverting element includes a second inverter connected between the second node and the second output node.

4. The signal amplification circuit of claim 1, wherein the second logic value is the inverted first logic value.

5. The signal amplification circuit of claim 4, wherein the first inverting element pull-down drives the first output node when the level of the amplified signal is higher than the logic threshold, and pull-up drives the first output node when the level of the amplified signal is lower than the logic threshold, and the second inverting element pull-down drives the second output node when the level of the amplified signal bar is higher than the logic threshold, and pull-up drives the second output node when the level of the amplified signal bar is lower than the logic threshold.

6. A signal amplification circuit comprising:

a differential amplification unit configured to differentially amplify an input signal and an input signal bar obtained by inverting the input signal, and generate an amplified signal and an amplified signal bar;

a first inverting element configured to output a first logic value when the level of the amplified signal is higher than a logic threshold, and output a second logic value when the level of the amplified signal is lower than the logic threshold;

a second inverting element configured to output the first logic value when the level of the amplified signal bar is higher than the logic threshold, and output the second logic value when the level of the amplified signal bar is lower than the logic threshold;

a first averaging element configured to average the amplified signal and an output of the second inverting element; and a second averaging element configured to average the amplified signal bar and an output of the first inverting element, wherein the first averaging element comprises a first resistive element, and the second averaging element comprises a second resistive element.

7. The signal amplification circuit of claim 6, wherein the differential amplification unit comprises:

a first amplifier configured to generate the amplified signal by differentially amplifying the input signal and the input signal bar; and a second amplifier configured to generate the amplified signal bar by differentially amplifying the input signal and the input signal bar.

8. The signal amplification circuit of claim 6, wherein the second logic value is the inverted first logic value.

9. The signal amplification circuit of claim 6, wherein the first inverting element comprises a first inverter, and the second inverting element comprises a second inverter.

10. A signal amplification method comprising:

generating an amplified signal and an amplified signal bar by differentially amplifying an input signal and an input signal bar obtained by inverting the input signal;

generating a first output signal having a first logic value when the level of the amplified signal is higher than a logic threshold and a second logic value when the level of the amplified signal is lower than the logic threshold, and a second output signal having the first logic value when the level of the amplified signal bar is higher than the logic threshold and the second logic value when the level of the amplified signal bar is lower than the logic threshold; and averaging the amplified signal and the second output signal, and averaging the amplified signal bar and the first output signal, wherein, in the averaging of the amplified signal and the second output signal and the averaging of the amplified signal bar and the first output signal, a current is passed between a first node where the amplified signal is outputted and a second output node where the second output signal is outputted through a first resistive element, and a current is passed between a second node where the amplified signal bar is outputted and a first output node where the first output signal is outputted through a second resistive element.

11. The signal amplification method of claim 10, wherein the second logic value is the inverted first logic value.

12. The signal amplification method of claim 11, wherein the generating of the first output signal and the second output signal comprises:

pull-down driving the first output node when the level of the amplified signal is higher than the logic threshold, and pull-up driving the first output node when the level of the amplified signal is lower than the logic threshold; and pull-down driving the second output node when the level of the amplified signal bar is higher than the logic threshold, and pull-up driving the second output node when the level of the amplified signal bar is lower than the logic threshold.

13. A signal amplification circuit comprising:

a differential amplification unit configured to output an output signal and an output signal bar;

a first inverting element configured to output one of 2 logic values according to the level of the output signal;

a second inverting element configured to output one of 2 logic values according to the level of the output signal bar; and a current path configured to cross-couple the first and second inverting elements, wherein the current path includes one or more resistive elements.

14. The signal amplification circuit of claim 13, wherein the current path includes:

a first current path connected between a node of the output signal and an output node of the second inverting element; and a second current path connected between a node of the output signal bar and an output node of the first inverting element.

15. The signal amplification circuit of claim 13, wherein the first inverting element pull-down drives a first node of the output signal when the level of the output signal is higher than a logic threshold, and pull-up drives the first node when the level of the output signal is lower than the logic threshold, and the second inverting element pull-down drives the second node of the output signal bar when the level of the output signal bar is higher than the logic threshold, and pull-up drives the second node when the level of the output signal bar is lower than the logic threshold.

16. The signal amplification circuit of claim 13, wherein the differential amplification unit comprises one or more amplifiers configured to differentially amplify the input signal and the inverted input signal.

* * * * *